United States Patent [19]

Hasegawa

[11] 4,009,445
[45] Feb. 22, 1977

[54] DIVIDER FOR AN ELECTRONIC TIMEPIECE

[75] Inventor: Ryozo Hasegawa, Tokyo, Japan

[73] Assignee: Kabushiki Kaisha Daini Seikosha, Japan

[22] Filed: Aug. 15, 1975

[21] Appl. No.: 605,062

[30] Foreign Application Priority Data

Aug. 19, 1974 Japan .................. 49-94805[U]

[52] U.S. Cl. .................. 328/49; 328/48; 58/23 R
[51] Int. Cl.² ......................... H03K 21/36
[58] Field of Search .............. 328/48, 49; 58/23 R

[56] References Cited

UNITED STATES PATENTS

| | | | |
|---|---|---|---|
| 3,800,233 | 3/1974 | Sauthier | 328/48 X |
| 3,812,669 | 5/1974 | Wiget | 58/23 R |
| 3,823,551 | 7/1974 | Riehl | 58/23 R |
| 3,833,854 | 9/1974 | Schonover | 328/48 X |
| 3,863,224 | 1/1975 | Alexander | 328/48 X |

Primary Examiner—John S. Heyman
Attorney, Agent, or Firm—Robert E. Burns; Emmanuel J. Lobato; Bruce L. Adams

[57] ABSTRACT

A divider for an electronic timepiece comprises a multistage divider circuit having a plurality of ½ dividing stages connected in cascade. Logic circuitry connected to the first and last stages develops a preselected number of pulse signals smaller in number than the dividing number of the divider circuit to effect selective stopping of the counting of only one input signal pulse applied to the divider circuit to thereby obtain fine adjustment of the final output signal pulses.

2 Claims, 5 Drawing Figures

FIG. I

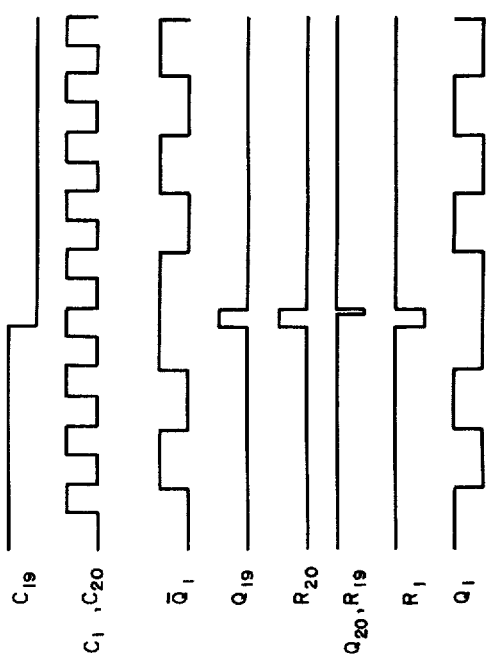
FIG. 4
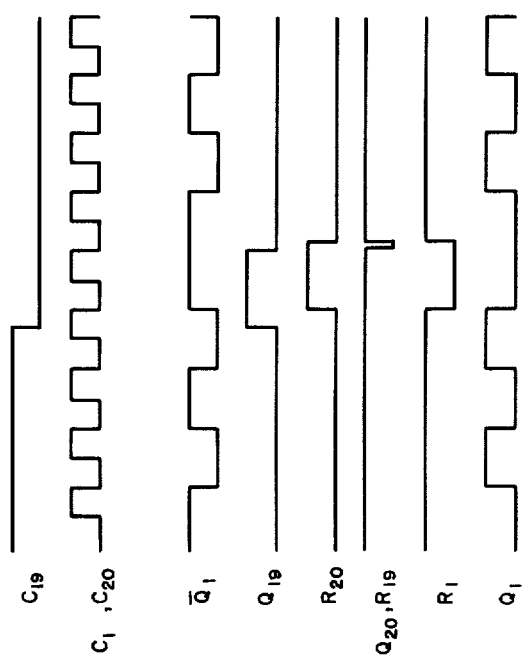
FIG. 3a
FIG. 3b 4,009,445

DIVIDER FOR AN ELECTRONIC TIMEPIECE

BACKGROUND OF THE INVENTION

This invention relates to a divider for an electronic timepiece having means for obtaining the voluntary number of pulse signals which are smaller than the dividing number of the divider circuit against the final one output periodical term by adding the pulses.

In the conventional type electronic timepiece, it is very difficult to make up a quartz vibrator which is easily employed as a time-standard for a wrist watch and it is common to employ a trimmer condenser in the oscillator circuit for adjusting the oscillator frequency and obtaining a predetermined frequency. However, it is not preferable to employ such a trimmer condenser in to the oscillator circuit, because said trimmer condenser has a temperature characteristic which accordingly changes the oscillating frequency whereby the operation for adjusting the frequency of the oscillating circuit requires adjustment of said trimmer condenser and a temperature compensating condenser.

OBJECT OF THE INVENTION

The present invention aims to eliminate the above noted difficulty and insufficiency, and therefore it is the primary object of the present invention to provide a divider circuit for obtaining an accurate time signal with a rough finishing of the vibrator and at low cost. Further object of the present invention is to provide a vibrator which vibrates or oscillates at a high accuracy and a further object is to reduce the amount of the flicker in one second signal.

Another object of the present invention is to eliminate the trimmer condenser for adjusting the frequency of the vibrator.

SUMMARY OF THE INVENTION

In a divider for an electronic timepiece, a divider circuit has a plurality of binary dividing circuits which are connected in cascade, the intermediate and final output signals of said divider circuit are changed to pulses which are not overlapped with each other. A preselected or voluntary number of pulse signals which are smaller than the dividing number of said divider circuit are obtained as the final one output periodical term by adding said pulses whenever said one pulse signal occurs in the input terminal of said dividing circuit and then stopping the count of only one input signal pulse whereby the flicker of the one second output signal is eliminated.

BRIEF DESCRIPTION OF THE DRAWINGS

The above mentioned and further objects, features and advantages of the present invention will become more obvious from the following description when taken in connection with the accompanying drawings, which show one preferred embodiment and wherein.

FIG. 4 shows the logical relation in the counting number N of [0] signal of four input NOR-gate circuit to one output periodical term of flip-flop circuit and the logical situation of adjustment terminals.

DETAILED DESCRIPTION OF THE INVENTION

This invention relates to the improvement of a circuit divider which is used for an electronic timepiece having a high frequency such as a quartz timepiece.

Figure 1:
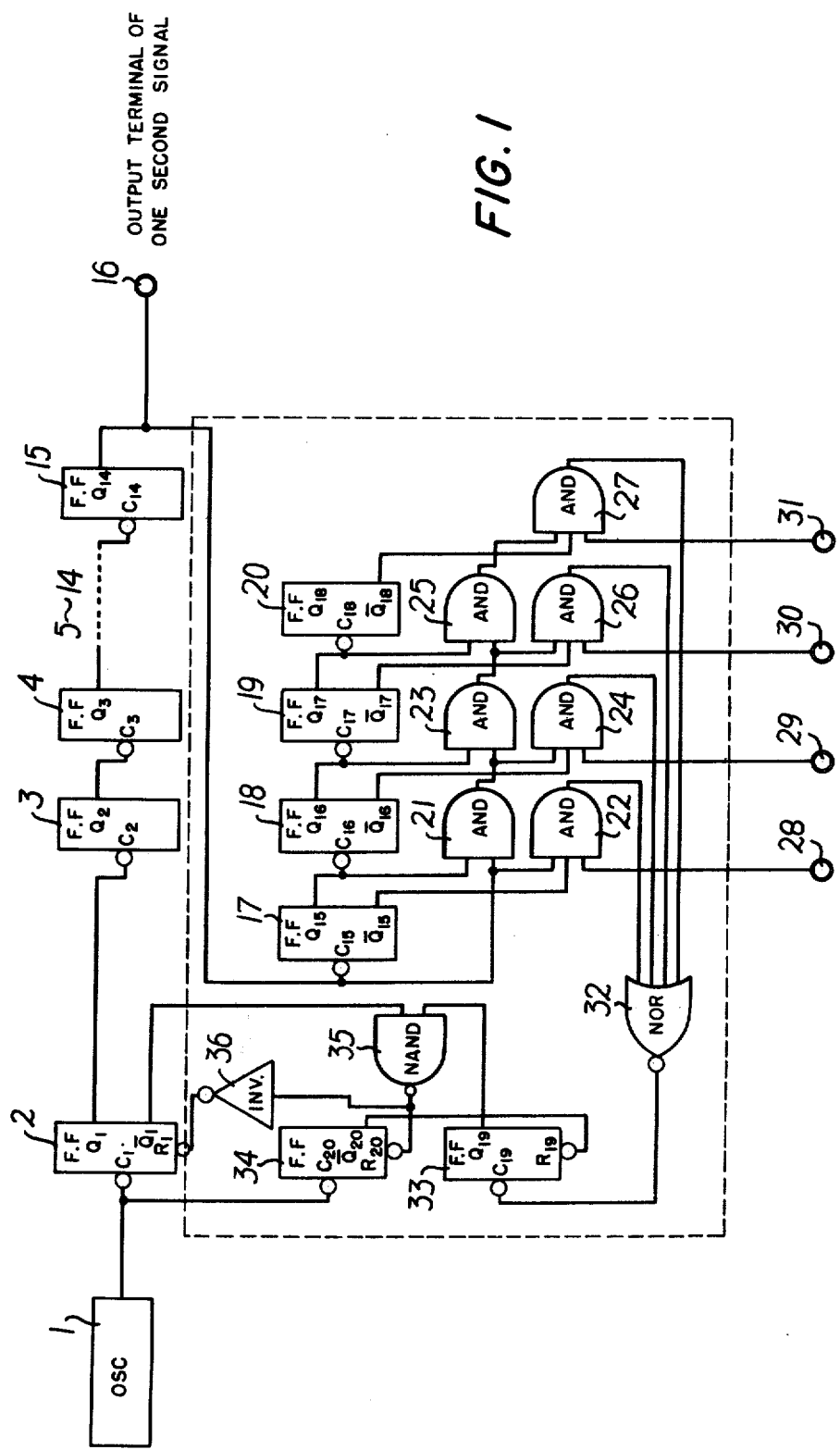
FIG. 1 shows a logic circuit of a quartz watch timepiece of the present invention.

Referring now to the embodiment of the present invention shown in the accompanying drawings, FIG. 1 shows a logical circuit block of a quartz watch of the present invention, numeral 1 designating a quartz oscillator which is vibrated at 16383.9685–16384.9685HZ, numeral 2–15 are flip-flop circuits, numeral 16 is one second signal output terminal, numeral 17–20 are flip-flop circuits, numeral 21–27 are two or three input AND-gate, numeral 28–31 are the slow and fast adjusting terminals, numeral 32 is a four input NOR-gate, numerals 33–34 are the flip-flop circuits, numeral 35 is a two input NAND-gate, and numeral 36 is an inverter.

The developed section of the present invention relates to the circuit blocks 17–36 which are surrounded by the dotted line, further numerals 1–15 denote elements known in the prior art of quartz watches except, of course, for the oscillating frequency which is quite different to that of the prior art.

Figure 2:
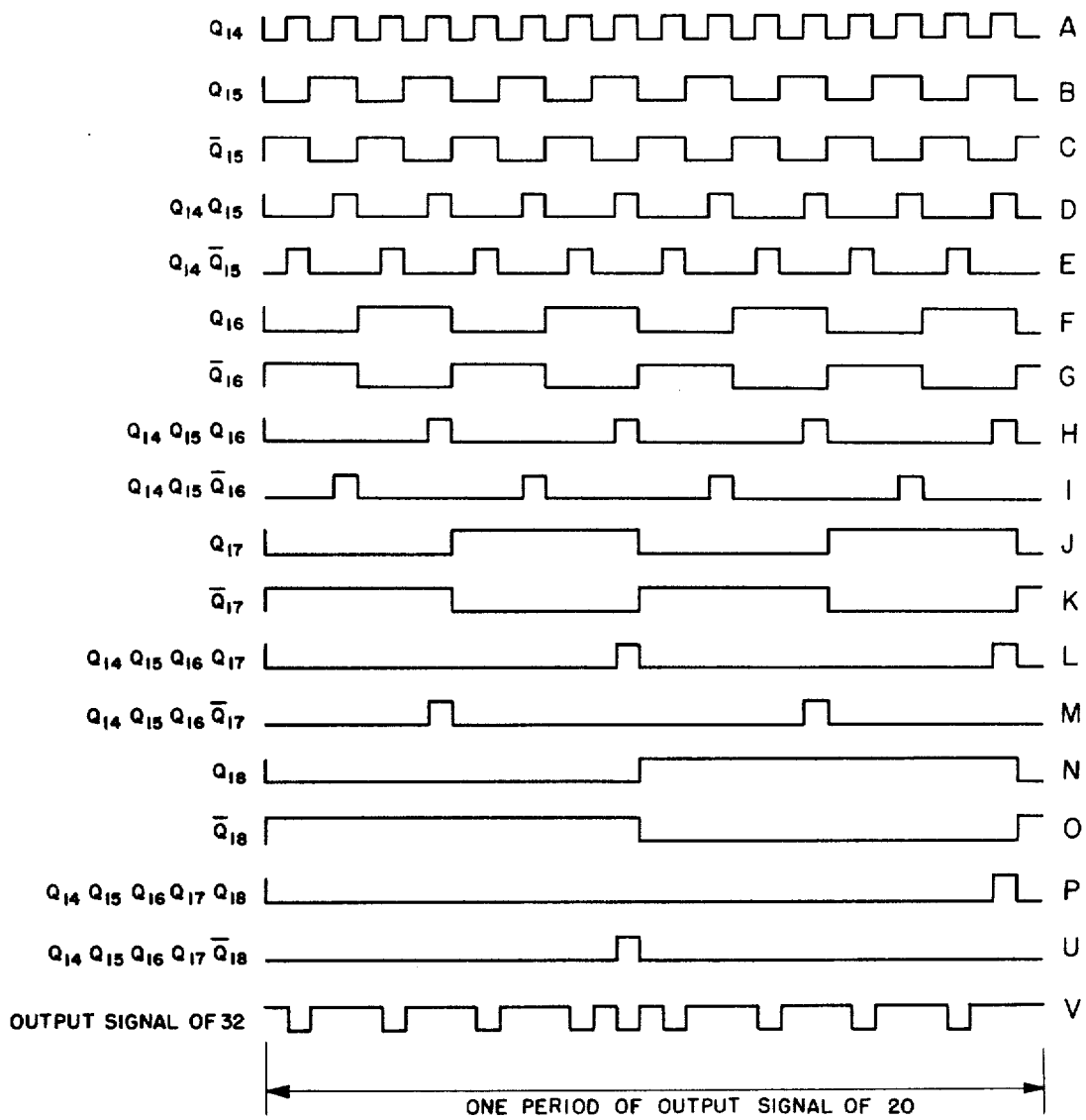
FIG. 2 shows the operational waveforms of the for flip-flop circuits, two or three input AND-gate and four input NOR-gate circuit, FIG. 3 (a) and (b) show the operational waveforms of the flip-flop circuit, two input AND-gate circuit and inverter.

FIG. 2 shows the operation of the flip-flop circuits 17–20 and the AND-gate circuits 21–27. A description of the operation of said flip-flop circuits and the AND-gate circuits follows:

In this occasion, the signal logical situation of said slow and fast adjusting terminals 28–31 is decided as a [1] signal. The wave form "A" represents the output signal "$Q_{14}$" of said flip-flop 15 which is fed to flip-flop circuit 17 which divides the signal by 2 and the divided output signal "$Q_{15}$" is indicated as wave form "B", further the inverted output signal "$\overline{Q_{15}}$" is indicated as wave form "C". The output signal of said AND-gate 21 between "$Q_{14}$" and "$Q_{15}$" is indicated as wave form "D", the output signal of said AND-gate 22 between "$Q_{14}$", "$\overline{Q_{15}}$" and said slow and fast adjusting terminal 28 is indicated as wave form "E". Further the positive output signal "$Q_{16}$" of said flip-flop circuit 18 which divided "$Q_{15}$" by 2 is indicated as wave form "F", further the inverted output signal "$\overline{Q_{16}}$" is indicated as wave form "G". Consequently the output signal of said AND-gate 23 between the output signal of said AND-gate 21 (as indicated wave form "0") and "$\overline{Q_{16}}$" is indicated as wave form "H".

The output signal of said AND-gate 24 between the output signal of said AND-gate 21, AND-signal of $Q_{16}$ and said adjusting terminal 29 is indicated as wave form "I". Further, the positive output signal $Q_{17}$ of said flip-flop circuit 19 which divided said signal $Q_{16}$ is indicated as wave form "J", the inverted output signal $\overline{Q_{17}}$ is indicated as wave form "K" whereby the output signal of said AND-gate 25 between said output signal (as indicated wave form "H") of said AND-gate 23 and said signal $\overline{Q_{17}}$ is indicated as wave form "L", further the output signal of said AND-gate 26 between the output signal of said AND-gate 23, signal $Q_{17}$ and AND-signal of said slow and fast adjusting terminal 30 is indicated as wave form "M".

Further, the positive output signal $Q_{18}$ of said flip-flop circuit 20 which divided the output signal of said $Q_{17}$ is indicated as wave form "N", the inverted signal $\overline{Q_{18}}$ is indicated as wave form "0", whereby the output signal of said AND-gate 27 between the output signal "L" of said AND-gate 25, signal $Q_{18}$ and AND-signal of said slow and fast adjusting terminal 31 is indicated as wave form "U".

According to the figures, each of the pulse signals denoted by waves "E", "H", "M" and "U" are respectively arranged without overlap, said pulse signals respectively have a different number of pulses with respect to one period of said signal $Q_{18}$ (as indicated as wave form "N") as follows:

Wave form "E" has eight pulses, wave form "H" has four pulses, wave form "M" has two pulses, wave form "U" has one pulse.

Further, since the output signals of each AND-gate circuits 22, 24, 26 and 27 are respectively connected to NOR-gate circuit 32, the pulses are added to said NOR-gate circuit. If the logical signals of said slow and fast adjusting terminal 31 for controlling the output signal of said AND-gate circuits 22, 24, 26 and 27 are set in 1 0 0 1, a number of said pulses to one period of signal $Q_{18}$ is as follows:

$$8 + 1 = 9$$

Consequently, it enables to obtain a preferable number of pulses from 0 to 15 with respect to one period of the final output signal $Q_{18}$ of said divider circuit by changing the logical signal of said adjusting terminals 28–31. The relations of number of pulses and the logical signal of said adjusting terminals are shown in FIG. 4.

The inverted output signal appears as the output signal of said NOR-gate 32 whenever the pulse signal is put into said NOR-gate 32 from AND-gate which is selected by said adjusting terminals. When said logical signals of said adjusting terminals 28, 29, 30 and 31 are set in 1 0 0 1, this logical situation is indicated as "V" of FIG. 2, therefore whenever said pulses "E" and "U" are applied, the output signal of said NOR-gate 32 is set to [0].

When the output signal of said NOR-gate 32 changes from [1] to [0], the output signal $Q_{19}$ of said flip-flop circuit 33 is changed from [0] to [1]. At that time when the output signal of said oscillator 1, namely the input signal "C" of said flip-flop circuit 2 and the input signal "$C_{20}$" of said flip-flop 34 are applied as indicated FIG. 3 (a), the reset input signal "$R_{20}$" of said flip-flop circuit 34 is changed from [0] to [1] by the starting pulse of the inverted output signal $Q_1$ of said flip-flop circuit 2 whereby the reset of said flip-flop circuit 34 is released.

On the other hand, when said flip-flop circuit 2 is reset, the counting of the output pulse of said oscillator 1 is stopped. However said flip-flop circuit 34 resets the flip-flop circuit 33 by said signal $Q_{20}$ of said flip-flop 34 changing from [0] to [1] due to the dropping of the output pulse of said oscillator 1 and is applied as the resetting input signal of the signal $R_{19}$, whereby the signal "$R_{20}$" is changed from [0] to [1]. Further said flip-flop circuit 2 is released from the resetting condition.

Since the resetting time of said flip-flop circuit 2 is kept in the situation of overcoming the time of the ending pulse of said input signal "C" of said flip-flop 2, one counting of the input pulse of said flip-flop circuit 2 is stopped by the change of the input signal to said flip-flop circuit $C_{19}$. This operation is shown in FIG. 3a.

In FIG. 3a, when the logical signal of said input signal "$C_{19}$" of said flip-flop 33 is changed from [0] to [1], the inverted output signal of said flip-flop circuit 2 is set to [0]. However in FIG. 3b, when the logical signal of said input signal "$C_{19}$" of said flip-flop circuit 33 is changed from [1] to [0], the inverted output signal $Q_1$ of said flip-flop circuit 2 is set to [1] whereby one-counting of the input pulse of said flip-flop circuit 2 is stopped by the change of the input signal to said flip-flop circuit $C_{19}$.

According to the above, the number of times of which said output signal of said NOR-gate 32 becomes [0] in the one period of the output signal $Q_{18}$ of said flip-flop circuit 20 is set to "N", the number of input pulses of said flip-flop circuit 2 per one period of said signal "$Q_{18}$" is as follows:

$$2^{18} = 262144$$

Therefore, the number of input pulses of said quartz oscillator 1 during one period of said signal "$Q_{18}$" is as follows:

$$2^{18} + N = 262144 + N$$

Consequently, as a whole, this divider of the present invention is operated as the divider having the number of dividing of $2^{18} + N$. Furthermore, said N is as follows:

$$0 \leq N \leq 16$$

This divider circuit of the present invention enables to have a preselected or voluntary number of dividing within a preselected range such as 262144–262159.

For example, if the frequency of said oscillator 1 is set to the allowable upper limit as 16384.9685HZ, and then the logical signal of said adjusting terminals 28–31 is set to [1] and further "N" is set to 15, therefore the number of dividing becomes to 262159 whereby the frequency of the output signal $Q_{18}$ of said flip-flop circuit 20 is as follows:

$$\frac{16384.9685}{262159} = \frac{1}{16} \times 1.0000019 HZ$$

$$\frac{1}{16} \times (1 + 1.9 \times 10^{-6}) HZ$$

Further, if the frequency of said oscillator 1 is set to the allowable lower limit as 16383.9685HZ, then the logical signal of said adjusting terminals 28–31 is set to [0] and "N" is set to "0", then the number of dividing becomes to 262144 whereby the frequency of output signal "$Q_{18}$" of said flip-flop circuit 20 is as follows:

$$\frac{16383.9685}{262144} = \frac{1}{16} \times 0.9999981 HZ$$

$$\frac{1}{16} \times (1 - 1.9 \times 10^{-6}) HZ$$

Consequently, the frequency of said oscillator is set within the above range, it enables to set the error of the frequency of output signal "$Q_{18}$" of said flip-flop circuit to 1/16 HZ within $$\pm 0.5 \times \frac{1}{2^{18}} = \pm 1.9 \times 10^{-6}$$

This value is equal to the difference in one day as follows:
$$\pm 1.9 \times 10^{-6} \times 86400 = \pm 0.16 \text{ seconds/one day.}$$

It can be appreciated that this is a very high accuracy.

The time accuracy of the output signal "$Q_{18}$" of said flip-flop circuit 20 and one second signal which appears at said one second signal output terminal have the same level. Consequently the one second signal is obtained as same as high level of above level. The output signal $Q_{18}$ of said flip-flop is 1/16HZ, namely has a period of 16 seconds, and has the above time accuracy, and each one second signal in said 1/16HZ has a different flicker by extracting the input signal. But it is preferable that said flicker be as small as possible.

The main feature of the present invention is to provide the means for reducing said flicker as far as possible. Namely, as clearly disclosed in FIG. 2, the pulse signals "E", "H", "M" and "U".

Therefore, since the signals of 0–15 in the input signal are extracted during 16 seconds, the flicker of said one second output signal is equal to the one input pulse signal, namely it is as follows:

$$\frac{1}{16384} \approx 61 \ (\mu s)$$

According to the present invention, the timepiece having a high accuracy is easily obtained. For purposes of improving the accuracy of the timepiece in conventional type by changing the number of dividing in the divider, the frequency of the oscillator becomes higher and needs the high frequency of several hundred KHZ or several MHZ whereby the troubles of the quartz oscillator, IC and the power consumption are encountered.

However, according to the present invention, it is able to obtain an accurate timepiece by using the technical level on the present whereby the number of stages of the flip-flop circuit increases. But, since the frequency is low, the trouble of power consumption is resolved by using the CMOS-circuit.

For example, in order to increase the accuracy of the timepiece, it is accomplished by adding the flip-flop circuit and AND-gate after said flip-flop circuit 20.

In accordance with the invention, the amount of flicker is small, and generally the flicker of the one second signal becomes larger according to the variable amount of the divider. However the operation of continuously counting more than two signals of the input pulse signal is not stopped, therefore the flicker amount in which said input pulse signal stopped the counting at the both end of said one second pulse signal is greatest. Therefore, said flicker amount does not exceed the amount of two input pulse signals.

Further, according to the invention, this economic effect is very large due to the coarse finishing of the oscillating element which is sufficient. In this embodiment, since the allowable range of the oscillator is 1 HZ to 16384HZ, the time error in one day is as follows:

$$\frac{86400}{16384} = 5.3 \ \text{second/day}$$

86400: second time in a day

It can be appreciated that this error is very acceptable. However it enables to improve this error by respectively adding two input AND-gates 21 and 22 to the upper flip-flop circuit.

Moreover, with the present invention, it is not necessary to employ the trimmer condenser. As a result, though the trimmer condenser is very high in cost, it is not needed according to the present invention. Though the frequency adjustment for the oscillator by the trimmer condenser and the temperature conpensation for the vibrator by the temperature compensating condenser require a very complicated working due to their respective relation, it becomes only necessary to effect the temperature compensation for the vibrator of the invention whereby the working or manufacturing process is greatly reduced and simplified. The alteration of the watch accuracy by the temperature characteristic of the trimmer condenser is excepted by not employing the trimmer condenser whereby the quality of the watch is improved.

Further, in a wrist watch, the space occupied by the trimmer condenser cannot be overlooked in the watch, though it is not included in the watch of the invention whereby the miniaturization of the watch is attained.

As another advantage, the construction of the circuit of the invention is relatively simple whereby the working becomes easier. As clearly described in FIG. 1, the additional working of the watch of the present invention is not so much as compared to the conventional quartz watch using 16384HZ, namely the additional part is restricted to the dotted line in FIG. 1. Further the switching operation for the accuracy adjustment is very easy.

As the sixth, it is not to consider the time delay of the circuit element whereby it has great merit from the stand point of power consumption. In general, in case of changing the number of dividing stages by the flip-flop circuit in series connection, the time delay of the elements becomes troublesome.

For eliminating this trouble, it is necessary to employ the element having the fast operation or to increase the voltage and current, however it is not preferable from the stand point of the IC-cost and the consumptive power. According to the present invention, unless the time delay of the elements is extremely large, for example there is the time delay, if said time is constant, the cycle of the counting stop becomes a constant and therefore it is sufficient to employ the ususal "IC".

What we claimed is:

1. A divider for an electronic timepiece comprising in combination: a mulitstage divider circuit having a plurality of ½ dividing circuit stages connected in series configuration to each other for receiving high frequency input signal pulses for counting and dividing them into lower frequency output signal pulses; means for changing the intermediate and final output pulse signals of said divider circuit to pulses which are not overlapped with each other; means for obtaining a preselected number of pulse signals which are smaller in number than the dividing number of said divider circuit against the final one output periodical term by adding said pulses; and means for selectively stopping the counting of only one input signal pulse to the first stage of said divider circuit.

2. A divider for an electronic timepiece comprising in combination: a multistage divider circuit having a plurality of ½ dividing circuit stages connected in series configuration to each other for receiving high frequency input signal pulses for counting and dividing them into lower frequency output signal pulses; a plurality of AND-gate circuits respectively connected to said divider circuits; a plurality of fast and slow adjusting terminals respectively connected to said AND-gate circuits; a NOR-gate circuit connected to the outputs of said AND-gate circuits; a flip-flop circuit connected to the output of said NOR-gate circuit; a NAND-gate circuit connected to the output of said flip-flop circuit; another flip-flop circuit connected to the output of said NAND-gate circuit; means for changing the intermediate and final output pulse signals of said divider circuit to pulses which are not overlapped with each other; means for obtaining a preselected number of pulse signals which are smaller in number than the dividing number of said divider circuit against the final one output periodical term by adding said pulses; and means for selectively stopping the counting of only one input signal pulse when said one signal pulse is at the first stage of said divider circuit.

* * * * *